US009804473B2

(12) United States Patent
Mende et al.

(10) Patent No.: US 9,804,473 B2
(45) Date of Patent: Oct. 31, 2017

(54) HIGH BANDWIDTH AND INPUT IMPEDANCE ELECTRO-OPTIC PROBE

(71) Applicant: Tektronix, Inc., Beaverton, OR (US)

(72) Inventors: Michael J. Mende, Portland, OR (US); Richard A. Booman, Lake Oswego, OR (US)

(73) Assignee: TEKTRONIX, INC., Beaverton, OR (US)

( * ) Notice: Subject to any disclaimer, the term of this patent is extended or adjusted under 35 U.S.C. 154(b) by 959 days.

(21) Appl. No.: 14/133,390

(22) Filed: Dec. 18, 2013

(65) Prior Publication Data
US 2016/0363833 A1    Dec. 15, 2016

(51) Int. Cl.
G02F 1/225    (2006.01)
G02F 1/01     (2006.01)
G02F 1/03     (2006.01)
G01R 15/24    (2006.01)
G02F 1/21     (2006.01)

(52) U.S. Cl.
CPC ........... *G02F 1/225* (2013.01); *G02F 1/0121* (2013.01); *G02F 1/0123* (2013.01); *G02F 1/0316* (2013.01); *G01R 15/241* (2013.01); *G02F 2001/212* (2013.01); *G02F 2201/122* (2013.01)

(58) Field of Classification Search
CPC ........... G02F 1/225; G02F 1/01; G02F 1/0123
See application file for complete search history.

(56) References Cited

U.S. PATENT DOCUMENTS

| 5,076,655 | A | 12/1991 | Bridges | |
| 5,359,449 | A * | 10/1994 | Nishimoto | G02F 1/0123 359/245 |
| 5,969,341 | A | 10/1999 | Ito et al. | |
| 6,192,167 | B1 * | 2/2001 | Kissa | G02F 1/0356 385/14 |
| 6,449,080 | B1 * | 9/2002 | McBrien | G02F 1/2255 359/245 |
| 8,463,081 | B1 * | 6/2013 | Kissa | G02F 1/2255 359/238 |
| 2002/0191266 | A1 * | 12/2002 | Melloni | G02F 1/225 359/246 |

FOREIGN PATENT DOCUMENTS

JP    09089957    4/1997

OTHER PUBLICATIONS

European Search Report for European Patent Application No. 14198898.0, dated Jun. 11, 2015, 7 pages, Munich.

* cited by examiner

Primary Examiner — Jonathan Hansen
(74) Attorney, Agent, or Firm — Marger Johnson

(57) ABSTRACT

An electro-optic modulator of a test and measurement system. The electro-optic modulator includes a first electrode, a second electrode with identical electrical characteristics as the first electrode and an optical waveguide between the first electrode and the second electrode. The first electrode and the second electrode present a balanced load to a device under test.

11 Claims, 3 Drawing Sheets

HIGH BANDWIDTH AND INPUT IMPEDANCE ELECTRO-OPTIC PROBE

TECHNICAL FIELD

This disclosure relates to electro-optic accessory designed for maximum bandwidth and high input impedance.

BACKGROUND

It is well known that electro-optic modulators are fabricated using a substrate of electro-optic material by forming an optical waveguide in the substrate and depositing thin film electrodes on the surface of the substrate. When a potential difference is established between the electrodes, an electric field is created within the substrate and this influences the refractive index of the electro-optic material. Accordingly, when light is propagated through the optical waveguide, its phase varies in dependence upon the magnitude of the imposed electric field.

Electro-optic modulators are typically designed for very high speed modulation of signals in optical fiber communication systems. As such, they are designed to be used in a 50 Ohm environment and have a 50 Ohm input impedance. To be used in a 50 Ohm system, the electrodes are designed as a 50 Ohm transmission line fabricated on the surface of an electro-optic crystal containing optical waveguides. This transmission line is typically terminated in its characteristic impedance (50 Ohms) so that the electrical signal does not reflect from the end of the transmission line.

The electric field generated between the electrodes modulates the index of refraction of the crystal in the optical waveguide which causes the phase of the light in the waveguide to change in proportion to the applied electric field. The electrical transmission line and the optical waveguide in this type of modulator can be designed so that the velocity of the electrical wave propagating in the electrical transmission line matches the velocity of propagation of the optical wave travelling in the optical waveguide. This velocity matching enables this type of structure to have very high sensitivity and very high bandwidth.

What is needed is an electro-optic modulator with a high input impedance and high common mode rejection ratio (CMRR). CMRR is not generally a consideration in conventional high-speed communication modulators.

SUMMARY

Certain embodiments of the disclosed technology include an electro-optic modulator of a test and measurement system. The electro-optic modulator includes a first electrode, a second electrode with identical electrical characteristics of the second electrode and an optical waveguide between the first electrode and the second electrode. The first electrode and the second electrode present a balanced load to a device under test.

DETAILED DESCRIPTION

Figure 1:
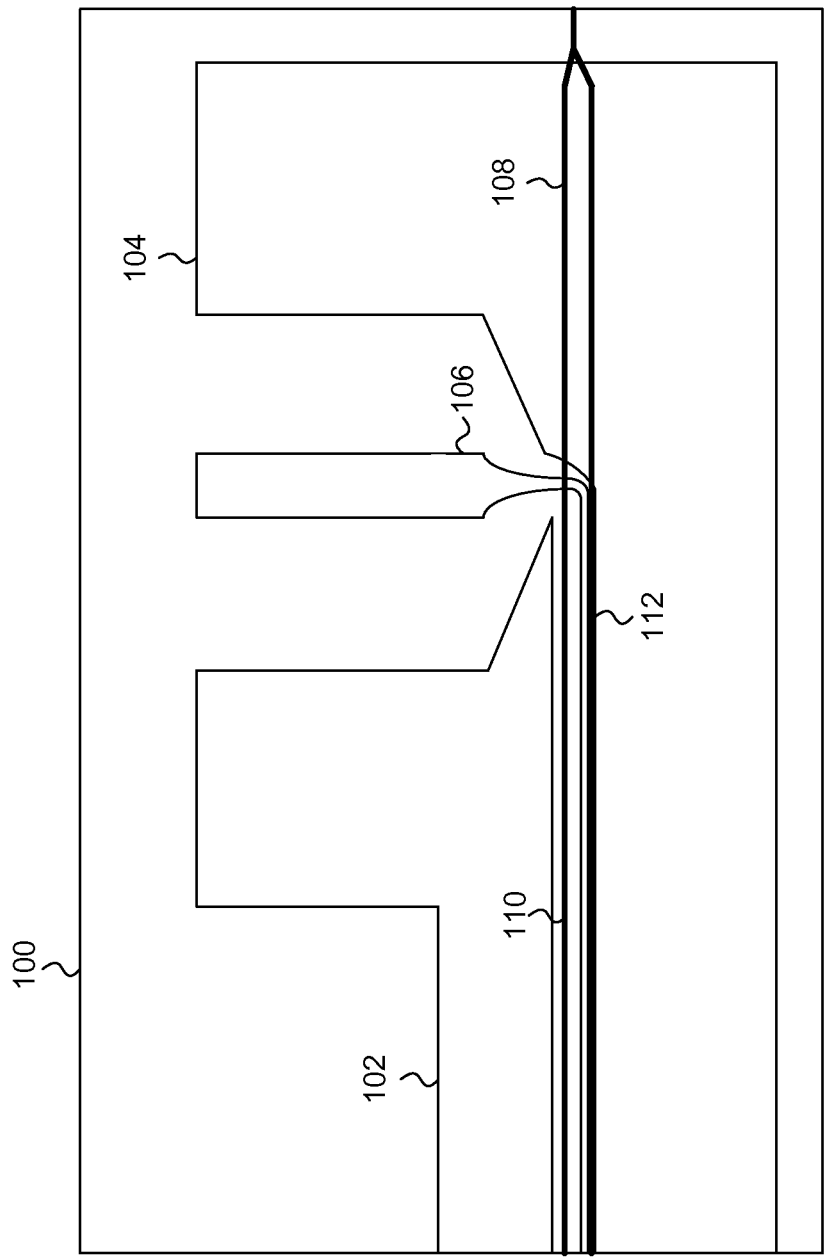
FIG. 1 illustrates an electrode configuration for a prior art electro-optic modulator.

In the drawings, which are not necessarily to scale, like or corresponding elements of the disclosed systems and methods are denoted by the same reference numerals.

FIG. 1 illustrates a conventional electro-optic modulator 100, such as a Mach-Zehnder modulator. This conventional electro-optic modulator includes two ground electrodes 102 and 104, and a signal electrode 106. The electrodes are placed directly on the crystal of the Mach-Zehnder modulator. The electrodes 102, 104, and 106 straddle the branches of the optical waveguide 108, with two branches 110 and 112. An electric field is applied to the waveguide 108 using the electrodes 102, 104, and 106, which causes a phase shift in the light in the waveguide 108. This allows for a voltage measurement of a device under test to be determined.

Light in an electro-optic modulator, such as a Mach-Zehnder modulator, is typically split into two branches. The relative phases of the light of the two branches is modulated by an applied electric field, and the light from the two branches is recombined to form constructive or destructive interference, depending on the relative phase of the light in the two branches 110 and 112 of the optical waveguide 108. The field is applied by the electrodes 102, 104, and 106 straddling the optical waveguide 108.

As seen in FIG. 1, this type of Mach-Zehnder electrode is inherently unbalanced since the outer electrodes are intended to be used as a radio-frequency ground. The optical and electrical signals move through this system in phase together. The effect of this is that the electrical and optical signals build up over time together since they are traveling together in phase.

The electrode structures of the disclosed technology allow for a high input impedance and also a high CMRR. That is, the electrode structure of the disclosed technology has a high input impedance, typically greater than 1 Megohm. Further, as described in more detail below, the electrode structures are balanced so that the electrodes are very similar in electrical characteristics, primarily length and capacitance. This leads to a high CMRR and also to a balanced impedance load being presented to the device under test. One such embodiment is shown in FIG. 2.

Figure 2:
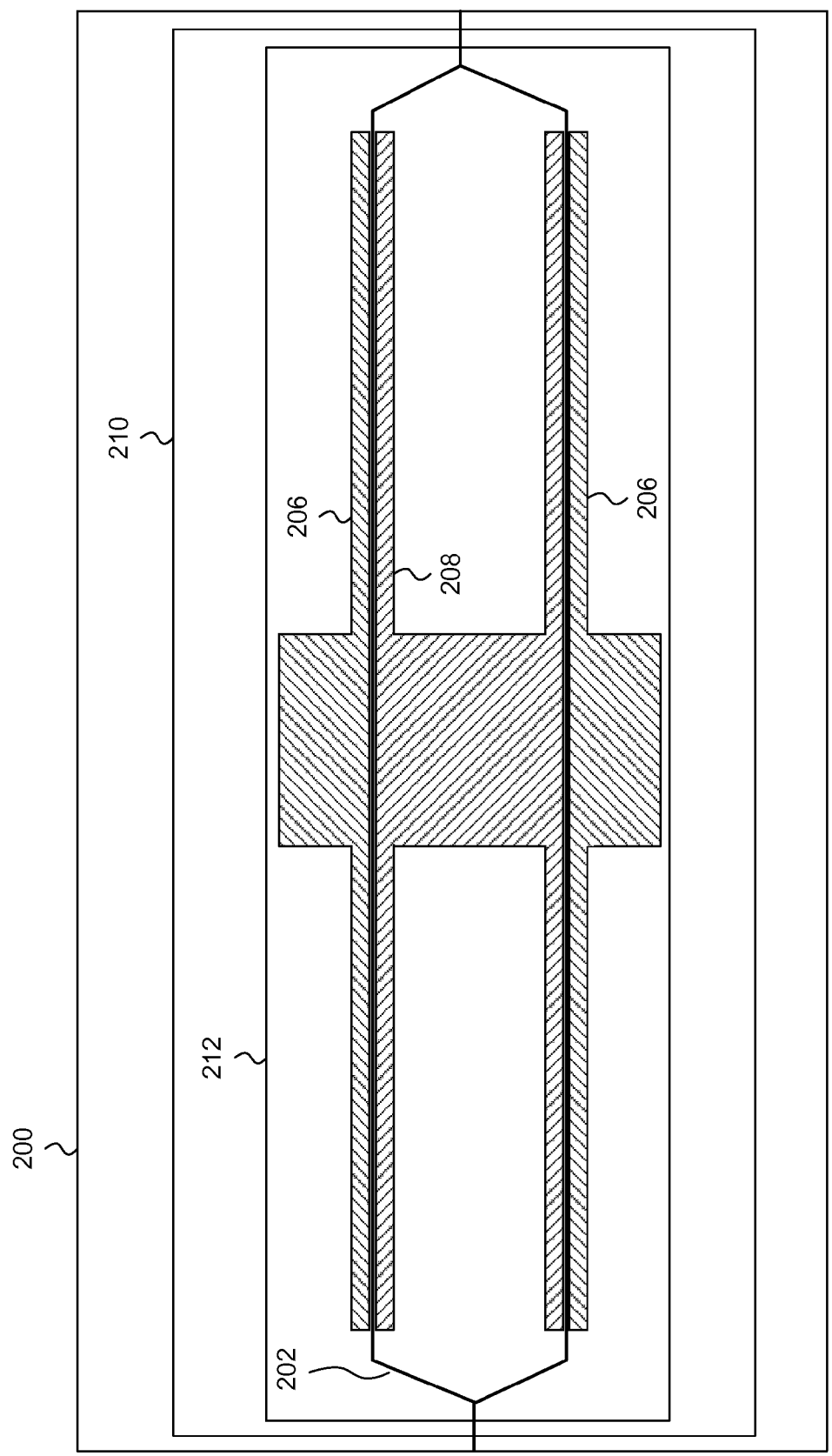
FIG. 2 illustrates an embodiment of an electrode configuration for an electro-optic modulator of the disclosed technology.

FIG. 2 illustrates an electro-optic modulator 200. In this electro-optic modulator 200, the two light branches in the Mach-Zehnder modulator travel within optical waveguide 202. The two branches of optical waveguide 202 are located between electrodes 206 and 208. Electrode 206 is located on both sides of electrode 208. Electrodes 206 and 208 are located on a crystal substrate 212. Electrode 206 has the same electrical characteristics, such as length and capacitance, as electrode 208. Electrode 206, however, is composed of two segments, with half of the electrode 206 located adjacent to one side of electrode 208 and the other half of the electrode 206 located adjacent to the other side of electrode 208.

This electrode structure shown in FIG. 2 is driven differentially. The input signal comes into the structure from both sides of the structure through damping resistors (not shown) in order to balance an impedance load of electrode 206 and electrode 208 to the guard 210. Electrodes 206 and 208 are long and the ends of the electrodes 206 and 208 are unterminated. There is a trade-off between the electrode length, the sensitivity of the sensor and the frequency response. Longer electrodes will improve the sensitivity (reduce the pi-voltage) but also reduce the frequency response. The input signal is applied between electrodes 206 and 208. That is, the positive input from a device under test is connected to one of the electrodes and the negative input from the device under test is connected to another one of the electrodes.

In this electrode structure, a frequency response depends on the length of the electrodes 206 and 208. The electrodes 206 and 208 resonate since they do not form a transmission line and are not terminated in their characteristic impedance. The long electrodes 206 and 208, however, improve the sensitivity of the electro-optic modulator 200.

Figure 3:
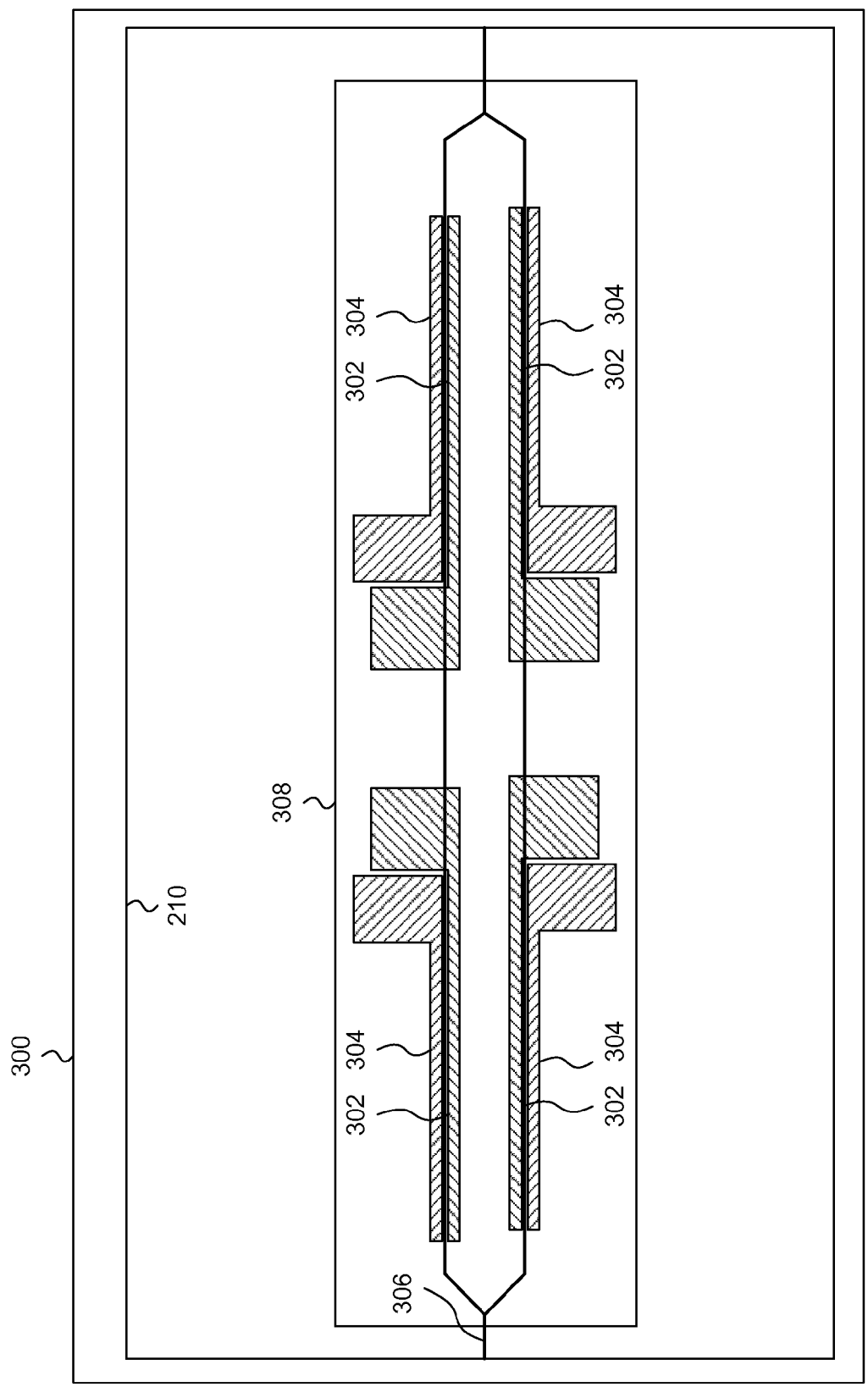
FIG. 3 illustrates an embodiment of an electrode configuration or an electro-optic modulator of the disclosed technology.

In order to maintain a high frequency response while maintaining a high input impedance and high CMRR, the electrodes may be segmented. Other embodiments may be as shown in FIG. 3. In this electro-optic modulator 300, the electrodes 302 and 304 are split into segments. Again, electrodes 302 and 304 have the same electrical characteristics, primarily length and capacitance. Electrodes 302 and 304 also located on a crystal substrate 308. Each segment is driven through a damping resistor (not shown) that provides isolation between the segments. Electrode 302 and 304 are not terminated and are also electrically long. Splitting the electrodes 302 and 304 improves their frequency response by increasing the resonant frequency of each separate electrode section of electrodes 302 and 304.

The two light branches of the electro-optic modulator are further branched and travel through waveguide 306, as shown in FIG. 3. Again, the structure shown in FIG. 3 is driven differentially. Mirroring of electrodes 302 and 304 provides for a higher sensitivity of the electro-optic modulator 300.

As seen in both FIGS. 2 and 3, the electrodes within the electro-optic modulators are balanced. That is, electrodes 206 and 208 are identical in electrical characteristics, while electrodes 302 and 304 are also identical in electrical characteristics. Further, electrodes 206, 208, 302, and 304 are unterminated. With the electrodes being balanced and unterminated, the electro-optic modulators of the disclosed technology are capable of presenting a balanced high impedance load to the device under test. The segmented electrodes improve the frequency response without sacrificing the sensitivity since the combined electrodes are fairly long but each segmented section is fairly short. Therefore, the electrodes 302 and 304 resonate at a higher frequency than FIG. 2 electrodes 206 and 208.

The electro-optic modulator of the disclosed technology is preferably used in a test and measurement system. The test and measurement system includes a test and measurement instrument, a controller, an accessory head, and a device under test. The electro-optic modulator of the disclosed technology is located in the accessory head an optical sensor. During operation, a light beam is sent from an optical transmitter in the controller to the accessory head and the electro-optic modulator of the disclosed technology. The accessory head measures the signal from the device under test in response to the light beam through the electro-optic modulator. Then, the resulting light beam is sent back to an optical receiver of the controller and converted to an electrical signal to be stored in a memory of the test and measurement instrument or to be displayed on a display. Electrodes 206, 208, 302 and 304 may be input electrodes, bias electrodes or a combination of input electrodes and bias electrode for the modulators 200 and 300. Further, the modulators 200 and 300 may also include an optional second set of electrodes, which may or may not be of similar construction, used for setting the bias point of the modulator.

The test and measurement instrument may be an oscilloscope, logic analyzer, spectrum analyzer or similar such devices having an accessory device interface for accepting an accessory device.

The term "controller" and "processor" as used herein is intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. An electro-optic modulator of a test and measurement system, comprising:
    a first electrode;
    a second electrode with identical electrical characteristics of the first electrode; and
    an optical waveguide between the first electrode and the second electrode,
    wherein ends of the second electrode and the first electrode are unterminated causing the first electrode and the second electrode to resonate when an electrical input is received.

2. The electro-optic modulator of claim 1, wherein the electro-optic modulator is a Mach-Zehnder modulator.

3. The electro-optic modulator of claim 1, wherein the second electrode is comprised of two halves, wherein half of the second electrode is adjacent to one side of the first electrode and the other half of the second electrode is adjacent to the other side of the first electrode.

4. The electro-optic modulator of claim 3, wherein the optical waveguide comprises two light branches, each light branch located between each half of the second electrode and the first electrode.

5. The electro-optic modulator of claim 1, wherein each of the second electrode and the first electrode are segmented into multiple portions.

6. The electro-optic modulator of claim 1, wherein the second electrode and the first electrode are located within a guard.

7. The electro-optic modulator of claim 1, wherein the electro-optic modulator is included an accessory head within a test and measurement system, the test and measurement system further including:
- a device under test;
- a controller connected to the accessory head; and
- a test and measurement instrument connected to the controller.

8. The electro-optic modulator of claim 1, further comprising two bias electrodes to set a bias point of the electro-optic modulator.

9. The electro-optic modulator of claim 8, wherein the two bias electrodes are similar construction to the first electrode and the second electrode.

10. The electro-optic modulator of claim 1, wherein the first electrode and the second electrode present a balanced high impedance load to a device under test.

11. The electro-optic modulator of claim 10, wherein the balanced high impedance load is greater than one megaohm.

* * * * *